(12) United States Patent
Cheng et al.

(10) Patent No.: US 10,115,805 B2
(45) Date of Patent: Oct. 30, 2018

(54) EXTREMELY THIN SILICON-ON-INSULATOR SILICON GERMANIUM DEVICE WITHOUT EDGE STRAIN RELAXATION

(71) Applicant: International Business Machines Corporation, Armonk, NY (US)

(72) Inventors: Kangguo Cheng, Schenectady, NY (US); Juntao Li, Cohoes, NY (US); Zuoguang Liu, Schenectady, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/456,650

(22) Filed: Mar. 13, 2017

(65) Prior Publication Data

US 2017/0186854 A1    Jun. 29, 2017

Related U.S. Application Data

(63) Continuation of application No. 14/964,026, filed on Dec. 9, 2015, now Pat. No. 9,659,960.

(51) Int. Cl.
| | |
|---|---|
| H01L 21/02 | (2006.01) |
| H01L 29/66 | (2006.01) |
| H01L 29/06 | (2006.01) |
| H01L 29/78 | (2006.01) |
| H01L 29/161 | (2006.01) |
| H01L 21/285 | (2006.01) |

(52) U.S. Cl.
CPC .. H01L 29/66583 (2013.01); H01L 21/02236 (2013.01); H01L 21/02532 (2013.01); H01L 21/28518 (2013.01); H01L 29/0649 (2013.01); H01L 29/161 (2013.01); H01L 29/7838 (2013.01)

(58) Field of Classification Search
None
See application file for complete search history.

(56) References Cited

U.S. PATENT DOCUMENTS

| | | | |
|---|---|---|---|
| 6,274,444 B1 | 8/2001 | Wang | |
| 6,649,457 B2 | 11/2003 | Hsu | |
| 7,084,460 B2 | 8/2006 | Chen et al. | |
| 7,384,830 B2 | 6/2008 | Cohen | |

(Continued)

OTHER PUBLICATIONS

Non-Final Office Action dated Oct. 11, 2016, received for U.S. Appl. No. 14/964,026.
List of IBM Patents or Patent Applications Treated as Related.

*Primary Examiner* — Thao P Le
(74) *Attorney, Agent, or Firm* — Fleit Gibbons Gutman Bongini Blanco PL; Thomas S. Grzesik

(57) ABSTRACT

A method for forming a semiconductor structure includes forming a strained silicon germanium layer on top of a substrate. At least one patterned hard mask layer is formed on and in contact with at least a first portion of the strained silicon germanium layer. At least a first exposed portion and a second exposed portion of the strained silicon germanium layer are oxidized. The oxidizing process forms a first oxide region and a second oxide region within the first and second exposed portions, respectively, of the strained silicon germanium.

20 Claims, 9 Drawing Sheets

(56) References Cited

U.S. PATENT DOCUMENTS

| | | |
|---|---|---|
| 7,691,727 B2 * | 4/2010 | Coronel .................. H01L 21/84 |
| | | 438/153 |
| 7,791,107 B2 | 9/2010 | Gupta et al. |
| 7,884,354 B2 | 2/2011 | Pillariselly et al. |
| 7,892,901 B2 | 2/2011 | Yeo et al. |
| 7,989,306 B2 | 8/2011 | Liu et al. |
| 8,440,550 B2 | 5/2013 | Wang et al. |
| 8,859,348 B2 * | 10/2014 | Bedell ............... H01L 21/82380 |
| | | 257/E21.7 |
| 8,987,069 B1 | 3/2015 | Adam et al. |
| 9,761,498 B2 * | 9/2017 | Doris .................... H01L 21/845 |
| 2002/0088971 A1 * | 7/2002 | Tezuka .................... H01L 21/84 |
| | | 257/19 |
| 2002/0168802 A1 | 11/2002 | Hsu et al. |
| 2006/0214257 A1 * | 9/2006 | Ninomiya ......... H01L 21/26506 |
| | | 257/502 |
| 2007/0238268 A1 | 10/2007 | Leusink |
| 2008/0064174 A1 | 3/2008 | Coronel et al. |
| 2009/0085062 A1 | 4/2009 | Jin et al. |
| 2010/0078735 A1 | 4/2010 | Hoentschel et al. |
| 2010/0144121 A1 | 6/2010 | Chang et al. |
| 2014/0099774 A1 * | 4/2014 | Vincent ............. H01L 29/66795 |
| | | 438/431 |
| 2016/0071956 A1 | 3/2016 | Balakrishnan et al. |
| 2017/0005112 A1 * | 1/2017 | Chang ................ H01L 27/1211 |

\* cited by examiner

EXTREMELY THIN SILICON-ON-INSULATOR SILICON GERMANIUM DEVICE WITHOUT EDGE STRAIN RELAXATION

BACKGROUND OF THE INVENTION

The present disclosure generally relates to the field of semiconductors, and more particularly relates to semiconductor devices comprising a silicon germanium semiconductor layer without edge strain relaxation.

Strained silicon germanium-on-insulator (SGOI) has been demonstrated as a viable technique to increase fully depleted silicon-on-insulator (FDSOI) p-type field-effect-transistors (PFET) performance. However, when SGOI is implemented in real FDSOI technology there is usually a strain loss at the edge of the SGOI film resulting from the SGOI being patterned into separate active areas. Edge relaxation reduces the strain benefit and creates device variability.

SUMMARY OF THE INVENTION

In one embodiment, a method for forming a semiconductor structure is disclosed. The method comprises forming a strained silicon germanium layer on top of a substrate. At least one patterned hard mask layer is formed on and in contact with at least a first portion of the strained silicon germanium layer. At least a first exposed portion and a second exposed portion of the strained silicon germanium layer are oxidized. The oxidizing process forms a first oxide region and a second oxide region within the first and second exposed portions, respectively, of the strained silicon germanium.

In another embodiment, a semiconductor structure is disclosed. The semiconductor structure comprises a substrate and a strained silicon germanium layer formed on the substrate. At least one active area is defined within a portion of the strained silicon germanium layer. A first oxide region is within and formed from the strained silicon germanium layer. A second oxide region is within and formed from the strained silicon germanium layer. The portion of the strained silicon germanium layer is situated between and contacts the first and second oxide regions.

In yet another embodiment, an integrated circuit is disclosed. The integrated circuit comprises a semiconductor structure. The semiconductor structure comprises a substrate and a strained silicon germanium layer formed on the substrate. At least one active area is defined within a portion of the strained silicon germanium layer. A first oxide region is within and formed from the strained silicon germanium layer. A second oxide region is within and formed from the strained silicon germanium layer. The portion of the strained silicon germanium layer is situated between and contacts the first and second oxide regions.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
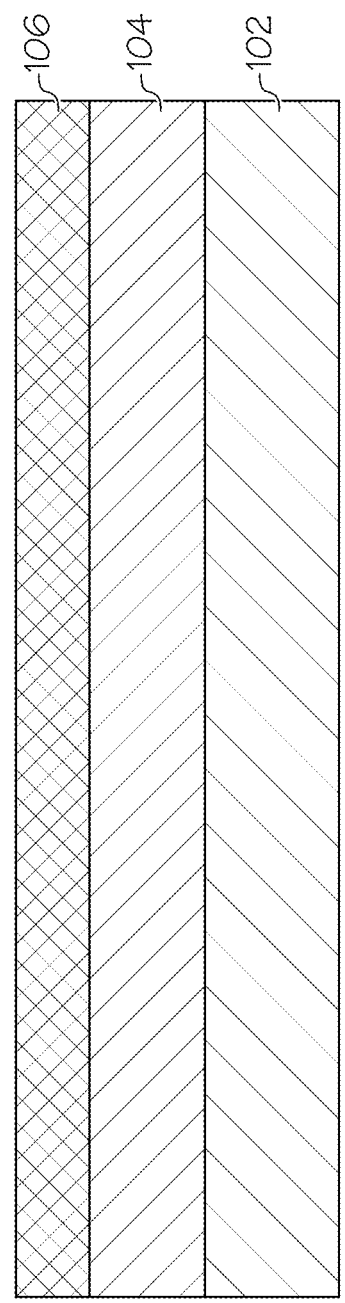
FIG. 1 is a cross-sectional view of a partial semiconductor structure according one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIG. 1 illustrates FIGS. 1-8 illustrate various processes for fabricating a semiconductor device without strain relaxation. As shown in FIG. 1, there is provided a handle substrate 102, a buried insulator layer (e.g., buried oxide (BOX)) 104, and a semiconductor layer 106. The handle substrate 102 can be a semiconductor substrate comprising a single crystalline semiconductor material such as single crystalline silicon, a polycrystalline semiconductor material, an amorphous semiconductor material, or a stack thereof. The thickness of the handle substrate 102 can be, for example, from 10 microns to 1,000 microns, although lesser and greater thicknesses can also be employed. A buried insulator layer 104 includes a dielectric material such as silicon oxide, silicon nitride, silicon oxynitride, or any combination thereof.

Figure 2:
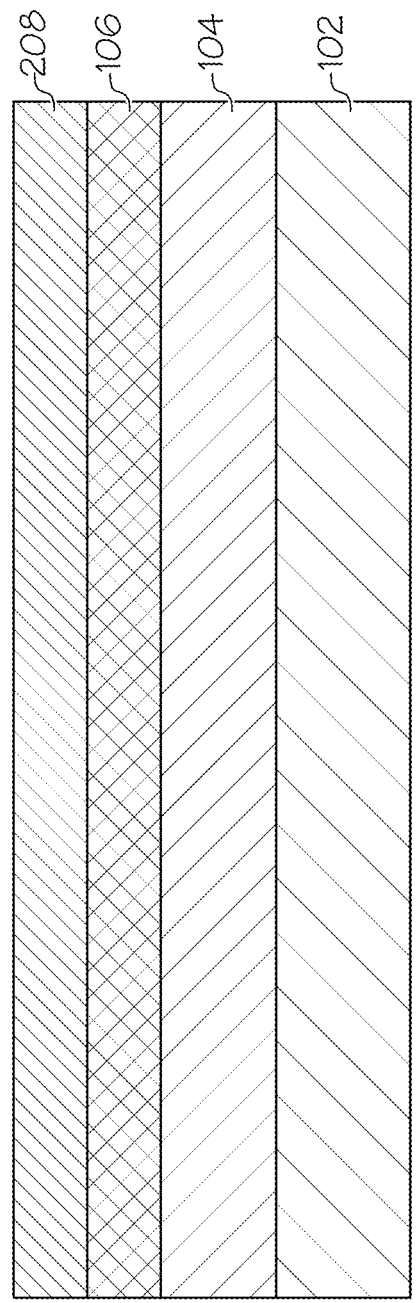
FIG. 2 is a cross-sectional view of the semiconductor structure after a silicon germanium layer has been formed thereon according one embodiment of the present disclosure.

In one embodiment, the semiconductor layer 106 is an extremely thin silicon-on-insulator (ETSOI) layer 106. This layer 106 can have a thickness ranging from 1 nm to 20 nm, and in one embodiment, has a thickness ranging from 3 nm to 10 nm. Alternatively, the process can begin with a "thick" SOI wafer having a thickness in the 30-90 nm range, and thinning can be performed using oxidation and a hydrofluoric acid (HF) wet etch to reduce the thickness (e.g., down to the 3-10 nm range). A silicon germanium (SiGe) layer 208 is epitaxially grown on semiconductor layer 106, as shown in FIG. 2.

Figure 3:
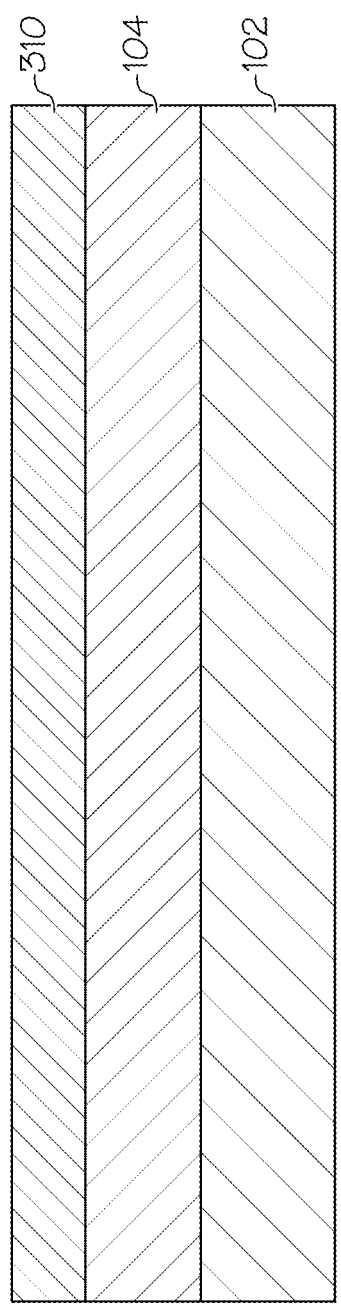
FIG. 3 is a cross-sectional view of the semiconductor structure after the silicon germanium layer and an underlying semiconductor layer have been converted to a compressively strained silicon germanium layer according one embodiment of the present disclosure.

One or more processes are performed to convert the bilayer comprising the SiGe layer 208 and the underlying semiconductor layer 106 to a compressively strained SiGe layer 310, as shown in FIG. 3. For example, a thermal mixing process, in one embodiment, is used in which the SiGe layer 208 and the silicon layer 106 are annealed in an inert ambient at a temperature (and duration) that allows for interdiffusion of Ge in the SiGe layer 208 throughout the Si layer 106. In another example, a condensation process is performed to convert the SiGe layer 208 and the silicon layer 106 to the compressively strained SiGe layer 310. During the condensation process, annealing is performed in an oxidizing ambient such as an ambient that contains oxygen, NO, $N_2O$, $H_2O$, or ozone. The SiGe layer 208 is oxidized, which drives Ge atoms from the SiGe layer 208 into the relaxed silicon layer 106. The oxidize layer is then removed using, for example, a wet etch process, such as etching in HF, thereby leaving only the SiGe layer 310 in the FET region. Since Ge lattice constant is larger than that of Si, SiGe layer 310 is under compressive strain. In one embodiment, the SiGe layer 310 comprises a thickness ranging from 3 nm to 10 nm, but other thicknesses are applicable as well.

Figure 4:
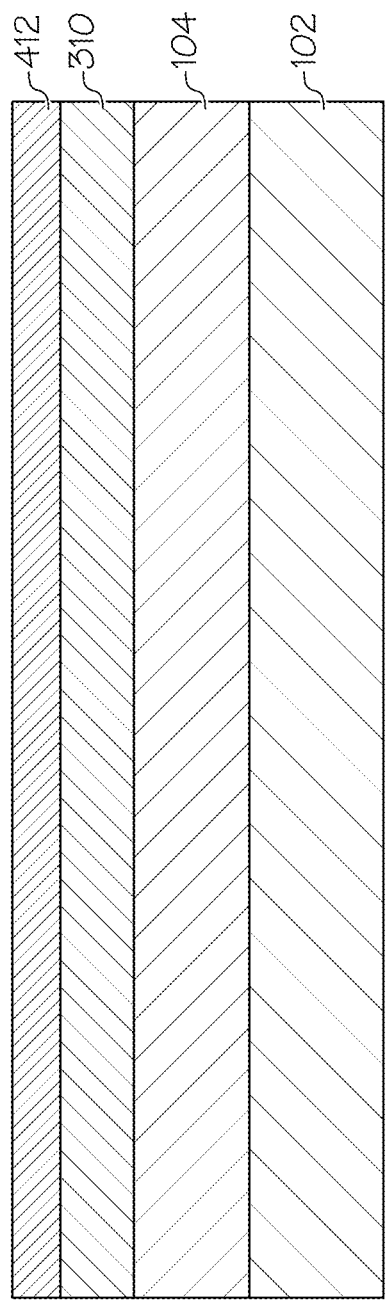
FIG. 4 is a cross-sectional view of the semiconductor structure after a hardmask layer has been formed over the compressively strained silicon germanium layer according one embodiment of the present disclosure.
Figure 5:
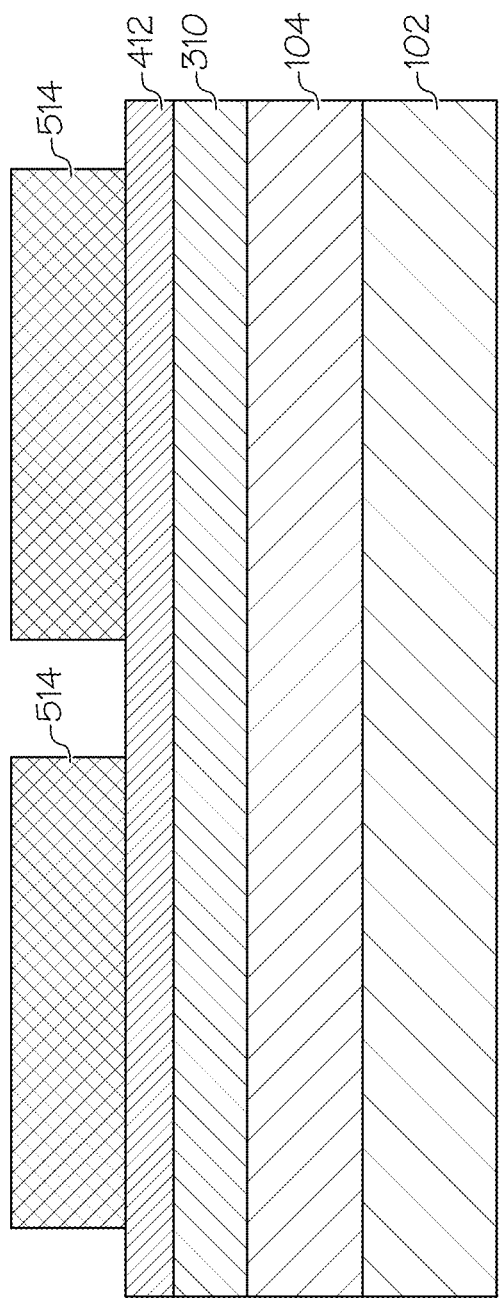
FIG. 5 is a cross-sectional view of the semiconductor structure after a blocking/masking layer has been formed and patterned over the hardmask layer according one embodiment of the present disclosure.

At this point in the fabrication process, conventional methods typically pattern the structure into active regions for respective devices by forming mask layers and etching the material to form active regions for separate devices such as NFET and/or PFET devices. However, because the compressive SiGe layer 310 is etched strain loss occurs at the edges of the layer 310 where the etching occurred. Therefore, one or more embodiments create separate active regions without requiring an etching process and preserve the strain in the SiGe layer 310. In particular, FIG. 4 shows one embodiment where a hardmask material such as silicon nitride or another material has been deposited and patterned to form a hardmask layer 412. The hardmask material can be deposited by a process such as chemical vapor deposition (CVD). A blocking/masking layer 514 is formed on the hardmask layer 412, which is subsequently patterned and etched, as shown in FIG. 5. The blocking/masking layer 514 is employed as a mask to etch the hardmask layer 412. The blocking/masking layer 514, in one embodiment, comprises a a soft mask, i.e., photoresist, formed by photolithography. In another embodiment, the blocking/masking layer 514 comprises a hard mask (silicon oxide (SiO2), silicon carbide (SiC), silicon nitride (Si3N4)). In this embodiment, a photoresist material is applied over the masking layer to effect patterning the hard mask layer.

Figure 6:
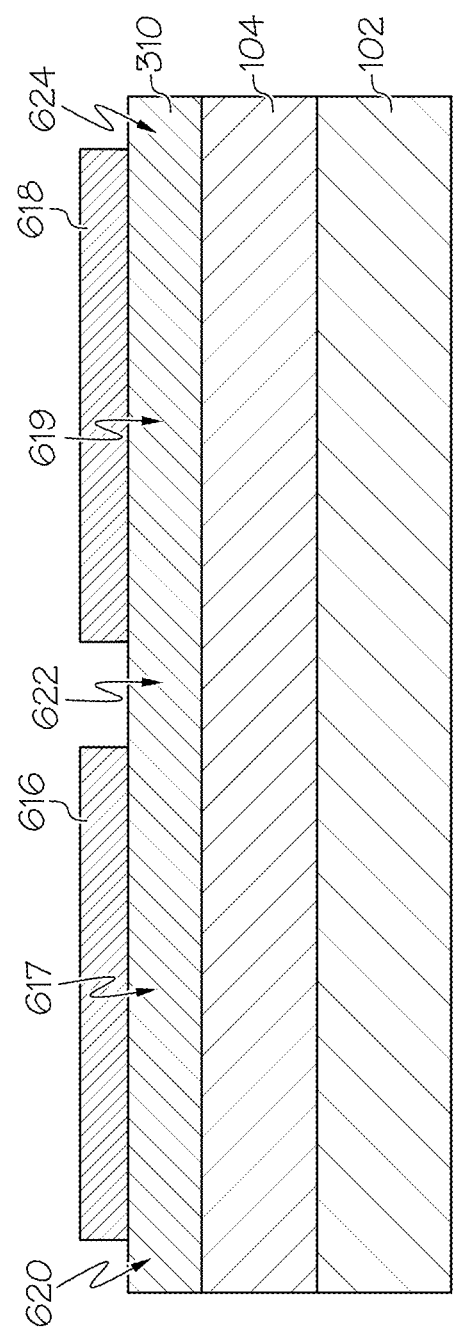
FIG. 6 is a cross-sectional view of the semiconductor structure after the blocking/masking layer has been removed according one embodiment of the present disclosure.
Figure 7:
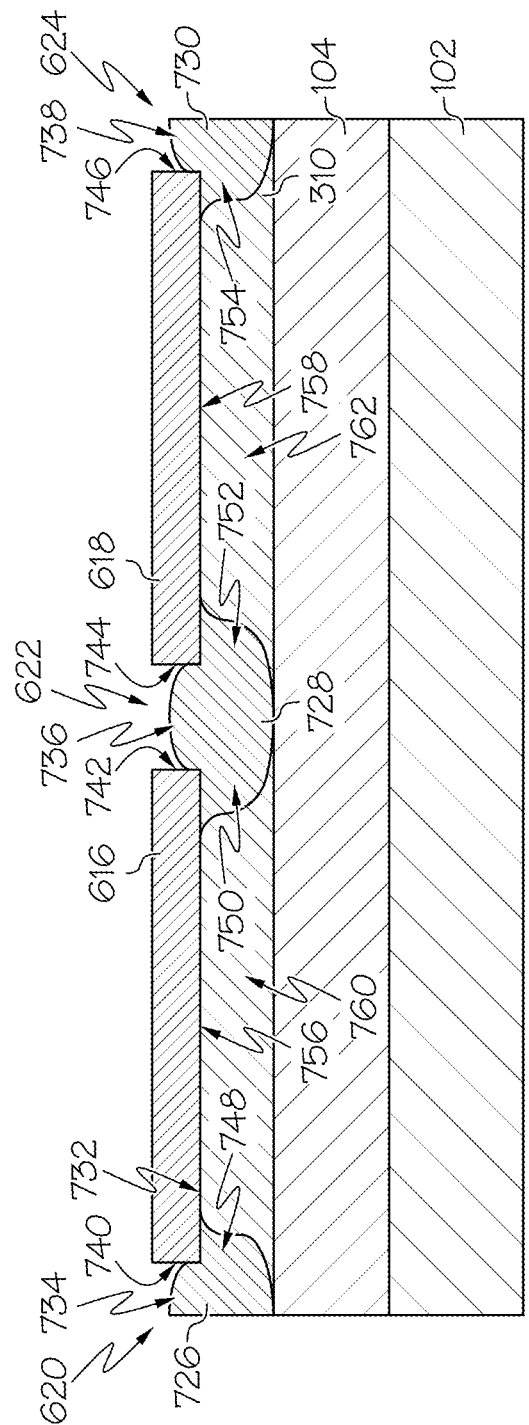
FIG. 7 is a cross-sectional view of the semiconductor structure after exposed portions of the compressively strained silicon germanium layer not underlying the patterned hard mask layer have been oxidized according one embodiment of the present disclosure.

After the hardmask layer 412 is etched, the blocking/masking layer 514 is removed leaving a plurality of patterned hardmask layers 616, 618 on portions of the compressive SiGe layer 310, as shown in FIG. 6. The patterned hardmask layers 616, 618 define the active areas 617, 619 for pFET devices. A thermal oxidation process is performed to oxidize the exposed portions 620, 622, 624 of the SiGe layer 310 (i.e., the portions of the SiGe layer 310 not underlying the patterned hardmask layers 616, 618. This process forms an oxide 726, 728, 730 within the exposed portions 620, 622, 624 of the SiGe layer 310, where the oxide 726, 728, 730 extends above a top surface 732 of the SiGe layer 310, as shown in FIG. 7. The portion 734, 736, 738 of the oxide 726, 728, 730 extending above the top surface 732 of the SiGe layer 310 contacts the sidewalls 740, 742, 744, 746 of the patterned hardmask layers 616, 618 and, therefore, does not extend over the portion 748, 750, 752, 754 of the oxide 726, 728, 730 directly under the patterned hardmask layers 616, 618. In one embodiment, the oxide 726, 728, 730 extends from above the top surface 732 of the SiGe layer 310 and extends through the SiGe layer 310 down to the BOX layer 104. In addition, the oxide 726, 728, 730 extends laterally within the SiGe layer 310 under and in contact with a portion of a bottom surface 756, 758 of the patterned hardmask layers 616, 618. In one embodiment, the thermal oxidation process consumes part of the silicon within the SiGe layer 310 to create an oxide comprising, for example, silicon dioxide. After the thermal oxidation process has been performed, the structure comprises patterned SiGe islands 760, 762 having been isolated by the oxide 726, 728, 730 without the SiGe 310 having been physically cut. Therefore, the patterned SiGe islands 760, 762 do not have any edge strain relaxation.

Figure 8:
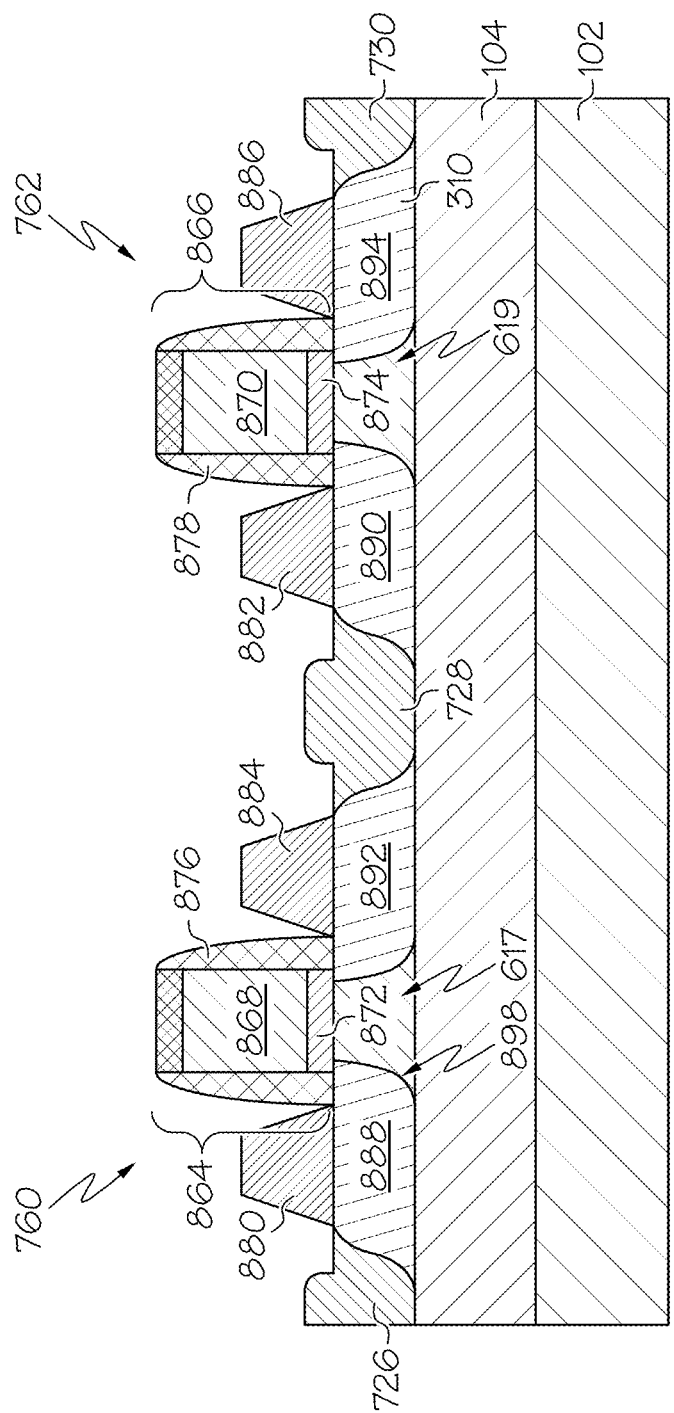
FIG. 8 is a cross-sectional view of the semiconductor structure after gate stacks, gate spacers, source/drain regions, source/drain extensions, and silicide areas have been formed thereon according one embodiment of the present disclosure.

The patterned hardmask layers 616, 618 are then removed to expose the underlying SiGe layer 310 and oxide 726, 728, 730. In one embodiment, a chemical mechanical polish (CMP) process, etch, or other process can be used to remove the hardmask layers 616, 618. Once the hardmask layers 616, 618 have been removed fabrication continues to form pFET devices on the patterned SiGe islands 760, 762. For example, a gate stack 864, 866 is formed over each of the active areas 617, 619, as shown in FIG. 8. Each gate stack 864, 866 includes a gate electrode 868, 870 over a gate dielectric 872, 874. By way of example only, the gate electrode 868, 870 can be formed from polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. The gate dielectric 872, 874 can be formed from, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum or aluminum. It is notable that the configuration of the gate electrode 868, 870 depicted in the figures is merely one example. By way of example only, gate stack configurations without a gate dielectric 872, 874 are possible.

The gate stacks 864, 866 can be formed by forming/depositing the gate stack materials (e.g., the gate electrode material 868, 870, the gate dielectric 872, 874, etc.) on the structure shown in FIG. 8 and then patterning the materials into the individual gate stacks. A hardmask (not shown) is used during the patterning. This gate stack hardmask can be left in place to protect the gate stacks during subsequent processing operations. It should be noted that other process for forming the gate stack such as a replacement metal gate (RMG) process can also be used. As shown in FIG. 8, spacers 876, 878 are present and formed on opposite sides of each of the gate stacks 864, 866. The spacers 876, 878 can be formed by depositing a suitable spacer material, such as silicon nitride, onto the structure and then patterning the spacer material into the individual spacers 876, 878 shown.

Referring to FIG. 8, making a MOSFET involves forming junctions. Generally speaking, a junction 898 is where two areas of dissimilar doping meet. The doping difference can be in the type of dopant (n or p, for example), or in terms of dopant concentration levels (heavily doped versus lightly), or both. In one embodiment, the dopants can be boron (B), gallium (Ga), indium (In), phosphorous (P), arsenic (As), and/or antimony (Sb). To form a junction, doped source and drains are made. There are many ways to make a source and a drain, including, but not limited to: (1) growing an in-situ doped raised source and drain followed by annealing; (2) implanting ions into a substrate followed by annealing; (3) growing a raised source and drain, implanting ions into the raised source and drain, followed by annealing, and (4) any suitable combination of those ways. Any of the methods may employ optional off-set spacers 876, 878 formed on the sidewalls of the dummy gate prior to source/drain formation. The optional off-set spacers 876, 878 can be made from silicon nitride ($Si_xN_yH_z$), silicon oxides ($SiO_xH_y$) or other materials.

FIG. 8 shows a raised source/drain as produced by growing an in-situ doped raised source and drain followed by annealing. Here, the raised source 880, 882 and raised drain 884, 886 are formed by epitaxy. Then the raised source 880, 882 and raised drain 884, 886 are annealed which drives some of the dopants from the raised source 880, 882 and raised drain 884, 886 into the SiGe layer 310 for each island 760, 762 to form source extensions 888, 890 and drain extension 892, 894. The junction 890 of the source extension 888/drain extensions 892 and the SiGe layer 617 is represented by the line separating the doped extension 888, 892 and SiGe layer 617. A junction 898 is where the low doping (or no doping) of the SiGe layer 617 meets the higher doping (or different doping species) of the source extension 888/drain extension 892. According to one embodiment, the source and drain regions of a PFET device(s) are formed from in-situ boron doped (ISBD) silicon germanium (SiGe). Namely, boron is introduced during growth of a SiGe epitaxial material in the source and drain regions of the PFET device(s).

The source and drain doping may be carried out by first masking the PFET device(s) (or alternatively the NFET device(s)) and forming the source and drain regions in the NFET device(s) (or alternatively the PFET device(s)). The mask is then removed and the process is repeated for the opposite polarity device, again using selective masking. The mask used during this process can be a hardmask formed from a suitable hardmask material, such as silicon nitride that is deposited onto the wafer and then patterned into the selective hardmask using standard lithography and etching techniques.

Silicide areas (not shown) are formed for contacts on the source/drain regions by depositing a metal, performing an anneal to form silicide, and then selectively removing the metal but leaving the silicide untouched (e.g., through an aqua regia wet etch). In this illustrative embodiment, the metal is nickel, cobalt, titanium, or platinum. Fabrication of the devices, such as forming contacts on the silicide areas and forming a dielectric layer(s) over the device, can then be completed utilizing one or more processes known in the industry.

Figure 9:
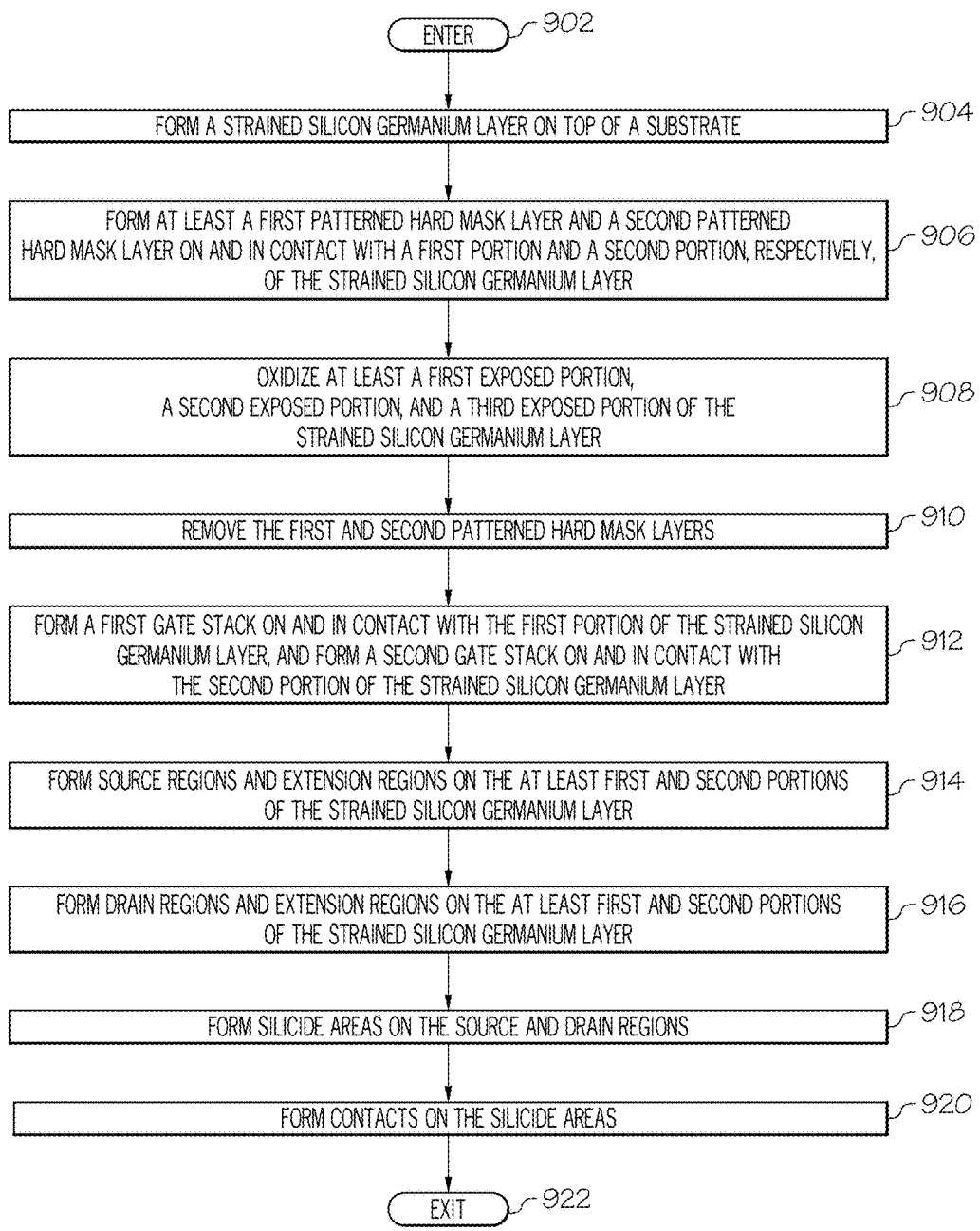
FIG. 9 is an operational flow diagram illustrating one process for forming a semiconductor structure according one embodiment of the present disclosure.

FIG. 9 is an operational flow diagram illustrating a process for forming a semiconductor structure. In FIG. 9, the operational flow diagram begins at step 902 and flows directly to step 904. It should be noted that each of the steps shown in FIG. 9 has been discussed in greater detail above with respect to FIGS. 1-8. A strained silicon germanium layer, at step 904, is formed on top of a substrate. At least a first patterned hard mask layer and a second patterned hardmask layer, at step 906, are formed on and in contact with a first portion and a second portion, respectively, of the strained silicon germanium layer. At least a first exposed portion, a second exposed portion, and a third exposed portion of the strained silicon germanium layer are oxidized, at step 908. The oxidizing forms a first oxide region and a second oxide region within the first and second exposed portions, respectively, of the strained silicon germanium. The oxidizing further forming a third oxide region within the third exposed portion of the strained silicon germanium layer.

The first and second patterned hardmask layers, at step 910, are removed. A first gate stack is formed on and in contact with the first portion of the strained silicon germanium layer, and a second gate stack is formed on and in contact with the second portion of the strained silicon germanium layer, at step 912. Source regions and extension regions, at step 914, are formed on the at least first and second portions of the strained silicon germanium layer. Drain regions and drain extension regions, at step 916, are formed on the at least first and second portions of the strained silicon germanium layer. Silicide areas, at step 918, are formed in the source and drain regions. Contacts, at step 920, are formed on the silicide areas. The control flow exits at step 922.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method of forming a semiconductor structure, the method comprising:
    forming a strained silicon germanium layer on top of a substrate;
    forming at least one patterned hard mask layer on and in contact with at least a first portion of the strained silicon germanium layer; and
    oxidizing at least a first exposed portion and a second exposed portion of the strained silicon germanium layer, the oxidizing forming at least one patterned strained silicon germanium area within the strained silicon germanium layer comprising a first oxide end region and a second oxide end region corresponding to first and second exposed portions, respectively, of the strained silicon germanium layer.

2. The method of claim 1, wherein the oxidizing further forms a portion of the first and second oxide regions within the at least first portion of the strained silicon germanium layer under and in contact with a bottom surface of the hard mask layer.

3. The method of claim 1, wherein the oxidizing further forms a portion of the first and second oxide regions above a top surface of the strained silicon germanium layer.

4. The method of claim 1, further comprising:
    removing the at least one patterned hard mask layer; and
    forming a gate stack on and in contact with the at least first portion of the strained silicon germanium layer.

5. The method of claim 4, wherein forming the gate stack comprises:
    forming a gate dielectric in contact with the first portion of the strained silicon germanium layer; and
    forming a gate electrode in contact with the gate dielectric.

6. The method of claim 4, further comprising:
    forming a source region and a source extension region on the at least first portion of the strained silicon germanium layer; and
    forming a drain region and a drain extension region on the at least first portion of the strained silicon germanium layer.

7. The method of claim 5, further comprising:
    forming silicide areas in the source and drain regions.

8. The method of claim 1, further comprising:
    forming at least one additional patterned hard mask layer on and in contact with at least a second portion of the strained silicon germanium layer.

9. The method of claim 8, wherein the oxidizing further comprising:
    forming the second oxide region within the second exposed portion of the strained silicon germanium layer between the at least one patterned hard mask layer and the at least one additional hardmask layer.

10. The method of claim 8, wherein the oxidizing further comprises:
    oxidizing at least a third exposed portion of the strained silicon germanium layer adjacent to the at least one additional patterned hardmask layer, the oxidizing forming a third oxide region within the third exposed portion of the strained silicon germanium.

11. The method of claim 8, further comprising:
    removing the at least one patterned hard mask layer and the at least one additional patterned hardmask layer;
    forming a first gate stack on and in contact with the at least first portion of the strained silicon germanium layer;
    forming a second gate stack on and in contact with the at least second portion of the strained silicon germanium layer;
    forming source regions and extension regions on the at least first and second portions of the strained silicon germanium layer;
    forming drain regions and drain extension regions on the at least first and second portions of the strained silicon germanium layer; and
    forming silicide areas in the source and drain regions.

12. The method of claim 1, forming an insulating layer on and in contact with the substrate.

13. The method of claim 12, wherein the strained silicon germanium layer is formed on and in contact with the insulating layer.

14. The method of claim 1, wherein forming the strained silicon germanium layer comprises:
    forming a semiconductor layer on the substrate; and
    epitaxially growing a silicon germanium layer on and in contact with the semiconductor layer, wherein the semiconductor layer and the silicon germanium layer form a bi-layer.

15. The method of claim 14, wherein forming the strained silicon germanium layer further comprises:
    converting the bi-layer into the strained silicon germanium layer.

16. The method of claim 15, wherein the bi-layer is converted into the strained silicon germanium layer utilizing a thermal mixing process.

17. The method of claim 15, wherein the bi-layer is converted into the strained silicon germanium layer utilizing a condensation process.

18. The method of claim 1, wherein forming the at least one patterned hard mask layer comprises:
   depositing a hard mask material on and in contact with the strained silicon germanium layer; and
   depositing a masking material on and in contact with the hard mask material.

19. The method of claim 18, wherein forming the at least one patterned hard mask layer further comprises:
   patterning the masking material into a masking layer; and
   etching the hard mask material corresponding to the masking layer, the etching forming the at least one patterned hard mask layer.

20. The method of claim 1, further comprising:
   growing an in-situ doped source region and an in-situ doped drain region on the at least first portion of the strained silicon germanium layer.

\* \* \* \* \*